(12) United States Patent
Nakashima et al.

(10) Patent No.: US 7,723,738 B2
(45) Date of Patent: May 25, 2010

(54) SEMICONDUCTOR LIGHT EMITTING ELEMENT AND SEMICONDUCTOR LIGHT EMITTING DEVICE

(75) Inventors: Saburo Nakashima, Yawata (JP); Koutarou Furusawa, Higashiosaka (JP); Takenori Goto, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 800 days.

(21) Appl. No.: 11/442,277

(22) Filed: May 30, 2006

(65) Prior Publication Data

US 2006/0267039 A1 Nov. 30, 2006

(30) Foreign Application Priority Data

May 31, 2005 (JP) ............................. P2005-160258
May 16, 2006 (JP) ............................. P2006-136981

(51) Int. Cl.
*H01L 29/205* (2006.01)
*H01L 33/00* (2010.01)

(52) U.S. Cl. .............................. 257/91; 257/88; 257/94; 257/40; 257/E31.001; 257/E21.001; 438/16; 438/22; 438/29

(58) Field of Classification Search ................... 257/13, 257/40, 79–103, 323, 919, E21.001, E33.001; 438/16, 22, 29
See application file for complete search history.

(56) References Cited

U.S. PATENT DOCUMENTS

| | | | | | |
|---|---|---|---|---|---|
| 5,670,797 | A | * | 9/1997 | Okazaki | 257/91 |
| 5,917,200 | A | * | 6/1999 | Kurata | 257/80 |
| 6,614,056 | B1 | * | 9/2003 | Tarsa et al. | 257/91 |
| 6,774,401 | B2 | * | 8/2004 | Nakada et al. | 257/82 |
| 7,334,907 | B2 | * | 2/2008 | Nagayama | 362/84 |
| 2004/0056260 | A1 | * | 3/2004 | Slater et al. | 257/79 |
| 2005/0218420 | A1 | * | 10/2005 | Bessho et al. | 257/99 |
| 2005/0219835 | A1 | * | 10/2005 | Nagayama | 362/84 |
| 2006/0043386 | A1 | * | 3/2006 | Furukawa et al. | 257/79 |

FOREIGN PATENT DOCUMENTS

JP 09-008403 1/1997

* cited by examiner

*Primary Examiner*—Zandra Smith
*Assistant Examiner*—Telly D Green
(74) *Attorney, Agent, or Firm*—NDQ&M Watchstone LLP

(57) ABSTRACT

A semiconductor light emitting element includes a semiconductor layer which has an electrode on at least one principal surface and a supporting substrate which is bonded with the electrode by a conductive adhesive. One of the semiconductor layer and the supporting substrate includes a protruded surface protruding in one portion on the principal surface, the other includes a junction surface which opposes the protruded surface, the junction surface is bonded with the protruded surface with the electrode and the conductive adhesive interposed between the protruded surface and the junction surface, and the junction surface is larger in area than a region to be bonded with the protruded surface.

18 Claims, 7 Drawing Sheets

SEMICONDUCTOR LIGHT EMITTING ELEMENT AND SEMICONDUCTOR LIGHT EMITTING DEVICE

CROSS REFERENCE TO RELATED APPLICATIONS

This application is based upon and claims the benefit of priority from prior Japanese Patent Application P2005-160258 filed on May 31, 2005, and P2006-136981 filed on May 16, 2006; the entire contents of which are incorporated by reference herein.

BACKGROUND OF THE INVENTION

1. Field of the Invention

The present invention relates to a semiconductor light emitting element and a semiconductor light emitting device.

2. Description of the Related Art

Recently in the semiconductor industry, a semiconductor light emitting element such as a light emitting diode element including a semiconductor layer has been actively developed. It is strongly demanded that, for the semiconductor light emitting element, improvement of light output and improvement of generating a large current should be addressed with a view to future substituting lighting.

To improve the light output of a semiconductor light emitting element, a method for replacing a growth substrate on which a semiconductor layer is grown with a supporting substrate capable of reflecting light emitting wavelength of the semiconductor layer is proposed (for example, Japanese Patent Laid-open Publication No. H9-8403).

In such a method, after a semiconductor layer is grown on an insulative growth substrate, a conductive supporting substrate having a characteristic of being capable of reflecting light emitted from the semiconductor layer can be reflected is adhered to a substantially entire surface of a semiconductor layer on the opposite side of the insulative growth substrate with use of a conductive adhesive. After that, a portion from the insulative growth substrate side to the semiconductor layer is removed so that the semiconductor layer is exposed. With this, a semiconductor light emitting element can be obtained. According to this, in the semiconductor light emitting element, the light emitting efficiency of the semiconductor light emitting element can be improved by causing the light emitted from the semiconductor layer to be reflected by the conductive supporting substrate, and to be returned to the semiconductor layer side.

However, the above-described method involves extrusion of the conductive adhesive from a junction surface at the time of carrying out full-surface junction between the semiconductor layer and the conductive supporting substrate by the conductive adhesive. For example, the conductive adhesive extruding from a space between the conductive supporting substrate surface and a p-side electrode formed on a principal surface of the semiconductor layer extends through a side of the semiconductor layer to reach an n-type semiconductor layer. In a further extreme case, the extruded conductive adhesive reaches an n-side electrode formed on a principal surface of the semiconductor layer on the opposite side to connect between the p-side electrode and the n-side electrode. With this, there is a problem that a leak current is generated.

Accordingly, the present invention has been made in view of the above-described problem, and it is an object to provide a semiconductor light emitting element and a semiconductor light emitting device, which are capable of reducing the generation of the leak current.

SUMMARY OF THE INVENTION

To solve the above-described problem, one aspect of the present invention is summarized in that a semiconductor light emitting element including a semiconductor layer which has an electrode on at least one principal surface and a supporting substrate which is bonded with the electrode by a conductive adhesive, in which one of the semiconductor layer and the supporting substrate includes a protruded surface extruding in one portion on a principal surface, the other includes a junction surface which opposes the protruded surface and is bonded with the protruded surface with the electrode and the conductive adhesive interposed between the protruded surface and the junction surface, and is larger than an area of a region to be bonded with the protruded surface.

According to such an aspect, the supporting substrate can receive the extruded conductive adhesive in a periphery of the protruded surface by bonding the protruded surface and the junction surface that is larger than the area of the region to be bonded with the protruded surface. Therefore, in the semiconductor layer, the extrusion of the conductive adhesive to the principal surface side, which is not adhered to the supporting substrate, can be reduced. With this, the semiconductor light emitting element can reduce generation of a leak current.

In the above-described one aspect, the protruded surface is formed in a near center of the principal surface of the semiconductor layer or the principal surface of the supporting substrate, and is boned with a near center of the junction surface.

In the above-described one aspect, the semiconductor layer or the supporting substrate is formed in a shape in which at least one portion thereof has the protruded surface as an upper surface and a lower surface is larger than that of the upper surface.

In the above-described one aspect, the semiconductor layer or the supporting substrate is formed in a prismoid shape or a circular truncated cone shape in which at least one portion thereof has the protruded surface as an upper surface, and a lower surface is larger than the upper surface.

In the above-described one aspect, a ratio of the area of the protruded surface to the area of the junction surface is 70 to 90%.

In the above-described one aspect, a height from the upper surface to the lower surface is 0.1 to 0.3 mm.

One aspect of the present invention is summarized in that a semiconductor light emitting device includes a mounting member, a semiconductor light emitting element mounted on a bottom surface of the mounting member, and a translucent resin provided in order to cover the semiconductor light emitting element inside of the mounting member, in which the semiconductor light emitting element includes a semiconductor layer having an electrode on at least one principal surface and a supporting substrate to be bonded with the electrode by a conductive adhesive, the supporting substrate includes a protruded surface extruding in one portion on a principal surface to be bonded by the conductive adhesive, and the semiconductor layer includes a junction surface which opposes the protruded surface, which is bonded with the protruded surface with the electrode and the conductive adhesive interposed between the protruded surface and the junction surface, and which is larger in area than a region to be bonded with the protruded surface, and the supporting substrate has a reflecting surface formed in an inclined shape in a periphery of the protruded surface.

One aspect of the present invention is summarized in that a semiconductor light emitting device includes a mounting member, a semiconductor light emitting element mounted on a bottom surface of the mounting member, and a translucent resin provided in order to cover the semiconductor light emitting element inside of the mounting member, in which the semiconductor light emitting element includes a semiconductor layer having an electrode on at least one principal surface and a supporting substrate to be bonded with the electrode by a conductive adhesive, the semiconductor layer includes a protruded surface extruding in one portion on a principal surface to be bonded by the conductive adhesive, and the supporting substrate includes a junction surface which opposes the protruded surface, which is bonded with the protruded surface with the electrode and the conductive adhesive interposed between the protruded surface and the junction surface, and which is larger in area than a region to be bonded with the protruded surface, the semiconductor layer has an incline in a periphery of the protruded surface, and the supporting substrate has a reflecting surface in a periphery of the region to be bonded with the protruded surface.

In the above-described one aspect, the translucent resin includes a phosphor which absorbs light emitted from the semiconductor light emitting element, and which converts it into light with another wavelength to be emitted outside.

In the above-described one aspect, any one of the semiconductor layer and the supporting substrate, which includes the protruded surface, has a shape in which at least one portion thereof has the protruded surface as an upper surface, and in which a lower surface is larger than the upper surface and has an angle formed by the lower surface and the reflecting surface is 30 to 60 degrees.

In the above-described one aspect, the reflecting surface is a reflecting film formed of a metal having a thickness of 0.1 µm and more.

In the above-described one aspect, surface roughness of the reflecting surface is 0.5 µm and less.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

It is to be noted, however, that the drawings are schematic and each size, ratio or the like are different from actual ones.

Therefore, a specific size and the like have to be judged with reference to the following description. Also, it goes without saying that, among the drawings, there are portions different in size relation and a ratio between respective sizes.

First Embodiment

Semiconductor Light Emitting Element

A semiconductor light emitting element will be described below.

Figure 1:
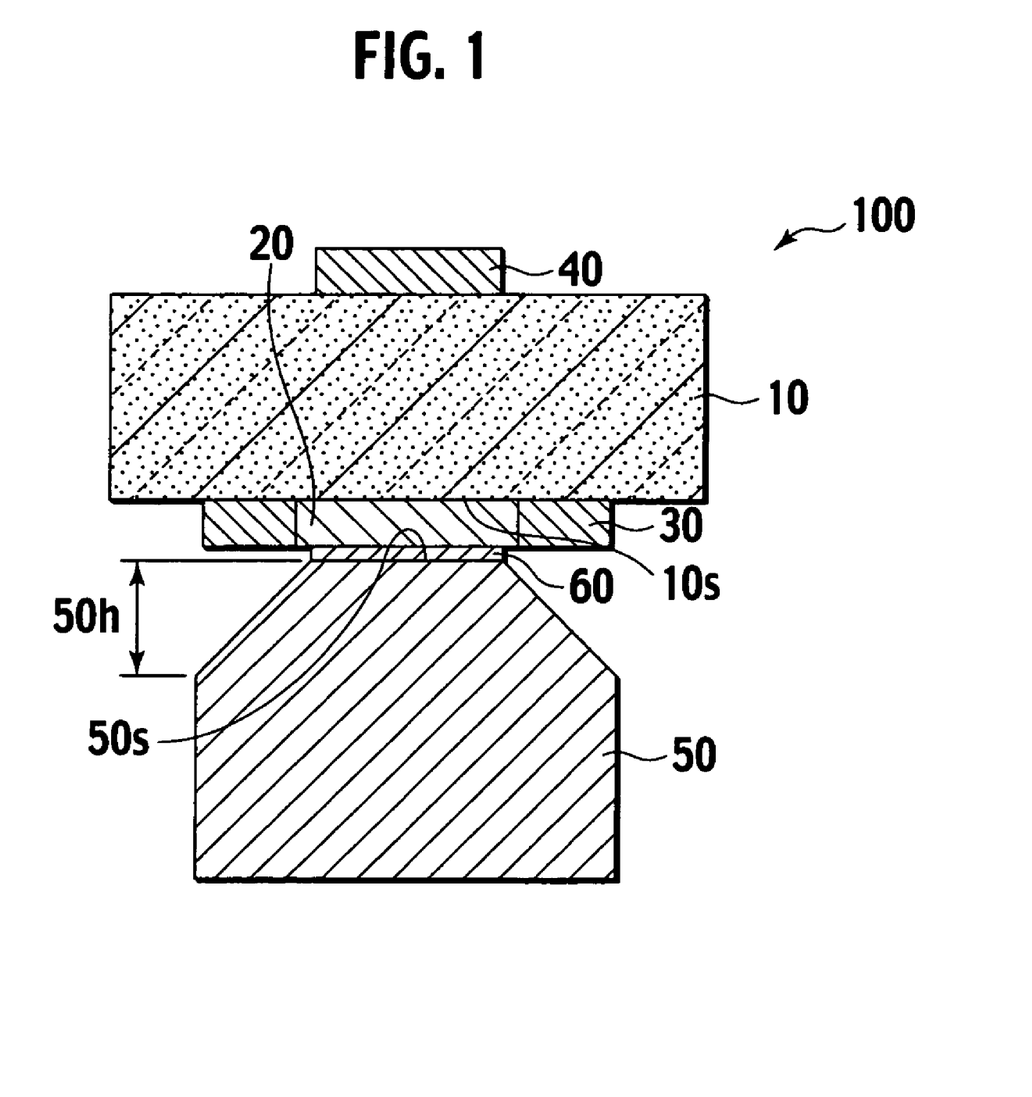
FIG. 1 is a cross section of a semiconductor light emitting element according to a first embodiment of the present invention.

FIG. 1 is a cross section showing a configuration of a semiconductor light emitting element 100 according to a first embodiment of the present invention.

As shown in FIG. 1, the semiconductor light emitting element 100 includes a semiconductor layer 10 having a p-side reflecting electrode 20 and a p-side transparent electrode 30 on one principal surface and an n-side electrode 40 on the other principal surface, a supporting substrate 50 including a protruded surface 50s extruding in one portion on the principal surface, and a conductive adhesive 60 for bonding the semiconductor layer 10 and the supporting substrate 50.

The semiconductor layer 10 has, for example, an LED configuration. For example, the semiconductor layer 10 is configured of an n-contact layer, an n-clad layer, an active layer, a cap layer, a p-clad layer, and a p-contact layer in this order, and is formed in a shape with approximately 300 µm square and a thickness of 10 µm. The semiconductor layer 10 includes a junction surface 10s which opposes the protruded surface 50s, which is bonded with the protruded surface 50s with the p-side reflecting electrode 20 and the conductive adhesive 60 interposed between the protruded surface and the junction surface, and which is larger in area than a region bonded with the protruded surface 50s. Specifically, in the present embodiment, the junction surface 10s is a principal surface of the p-contact layer of the semiconductor layer 10 (hereinafter the principal surface of the p-contact layer of the semiconductor layer 10 is referred to as a junction surface 10s).

The p-side reflecting electrode 20 is included on the junction surface 10s. The p-side reflecting electrode 20 reflects light emitted from the semiconductor layer 10 to the semiconductor layer 10. For example, the p-side reflecting electrode 20 is included in a region with 100 µm square and is configured of an Al layer with a thickness of 50 nm and an Ag layer with a thickness of 0.2 µm in this order from the junction surface 10s side.

The p-side transparent electrode 30 is included in a region in which the p-side reflecting electrode 20 is not formed on the junction surface 10s. The p-side transparent electrode 30 transmits the light emitted from the semiconductor layer 10. For example, the p-side transparent electrode 30 is configured of a Pd layer with a thickness of 100 nm, an Au layer with a thickness of 400 nm, and an Ni layer with a thickness of 200 nm in this order from the junction surface 10s side. In addition to this, the p-side transparent electrode 30 may be configured of a combination of an $In_2O_3$ layer and a $SnO_2$ layer, or only a $SnO_2$ layer.

Configurations of the p-side reflecting electrode 20 and the p-side transparent electrode 30 will be described by using FIG. 2.

Figure 2A:
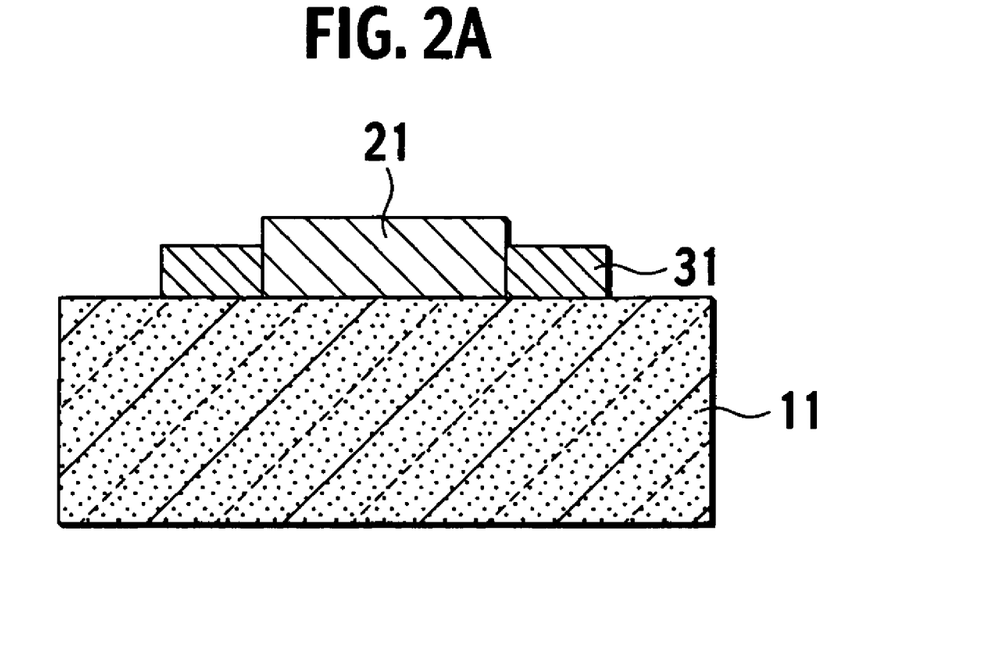
FIG. 2A is a partially enlarged cross section of the semiconductor light emitting element according to the first embodiment of the present invention.
Figure 2B:
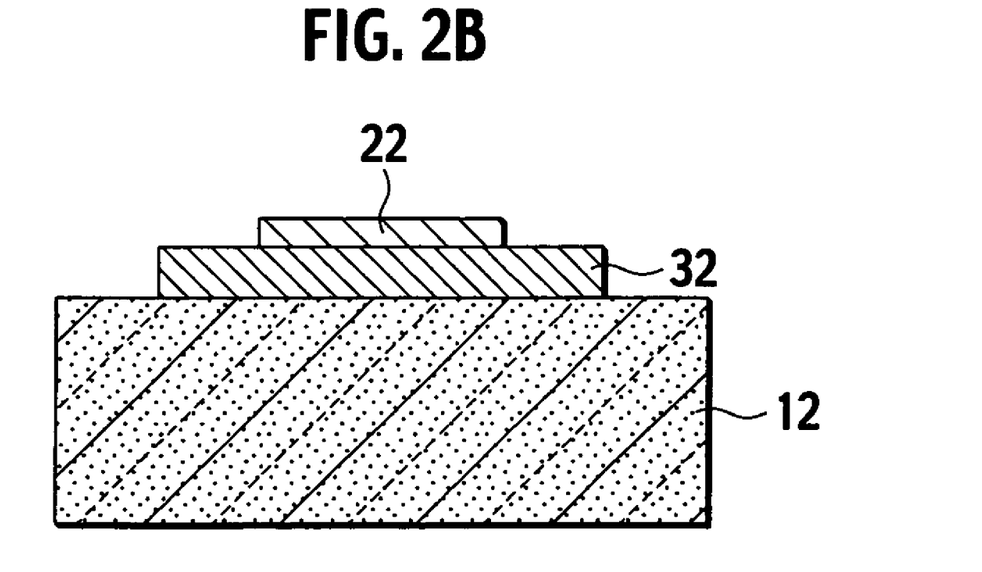
FIG. 2B is a partially enlarged cross section of the semiconductor light emitting element according to the first embodiment of the present invention.

A height of the p-side reflecting electrode may be equal to that of the p-side transparent electrode as shown in FIG. 1, and may be higher than that of the p-side transparent electrode as shown in FIGS. 2(a) and 2(b).

As shown in FIG. 2A, a p-side reflecting electrode 21 is formed in a near center of the junction surface of a p-contact layer of a semiconductor layer 11. In addition, a p-side transparent electrode 31 is formed in a periphery of the p-side reflecting electrode 21 on the junction surface of the p-contact layer of the semiconductor layer 11.

In addition, as shown in FIG. 2B, a p-side transparent electrode 32 may be formed in a near center of a junction surface of a p-contact layer of a semiconductor layer 12. In such a case, a p-side reflecting electrode 22 is formed in a near center on the p-side transparent electrode 32.

As shown in FIG. 1, the n-side electrode 40 is included on the principal surface of the n-contact layer on the opposite side of the junction surface 10s of the semiconductor layer 10. It is preferable that the n-side electrode 40 is included in a position facing the p-side reflecting electrode 20. The n-side electrode 40 is preferred to be a transparent electrode, and is preferred to have a pad electrode in one portion for connecting a gold wire.

The supporting substrate 50 is a substrate consisting of SiC, Si, Ge, oxides of copper, CuW, CuMo, GaAs, GaP or the like. The supporting substrate 50 has the protruded surface 50s extruding in one portion on the principal surface facing the junction surface 10s of the semiconductor layer 10. For example, the supporting substrate 50 is a rectangular parallelepiped with approximately 300 μm on a side. In addition, at least one portion of the supporting substrate 50 has a prismoid shape or a circular truncated cone shape which has the protruded surface 50s as an upper surface, and in which a lower surface thereof is larger than the upper surface. In addition, the supporting substrate height 50h, which is a height from the upper surface to the lower surface, is 0.1 to 0.3 mm.

The protruded surface 50s is bonded with the p-side reflecting electrode 20 included on the junction surface 10s of the semiconductor layer 10 by the conductive adhesive 60. The protruded surface 50s is formed in a near center of the principal surface of the supporting substrate 50 and is bonded with a near center of the junction surface 10s. The ratio of an area of the protruded surface 50s to an area of the junction surface 10s is 70 to 90%.

Adhesive materials such as solder, which contains gold, tin, palladium, nickel, carbon, or alloys containing these metals used for the conductive adhesive 60, for example, if metals are used for the conductive adhesive 60. An epoxy resin, a polyimide resin or the like, to which conductivity is added, can be used for the conductive adhesive 60, for example, if a resin is used for the conductive adhesive 60.

[Method of Manufacturing Semiconductor Light Emitting Element]

Processes carried out in a method for manufacturing a semiconductor light emitting element according to the present embodiment will be described below.

As a first process, the semiconductor layer 10 is formed on a growth substrate. For example, with use of Metal Organic Chemical Vapor Deposition method (MOCVD method), an n-contact layer, an n-clad layer, an active layer, a cap layer, a p-clad layer, and a p-contact layer, which consist of a nitride semiconductor, are formed in this order on a GaN substrate as the growth substrate.

Next, as a second process, a p-side electrode forming process is carried out in order to form a p-side reflecting electrode 20 and a p-side transparent electrode 30 on the p-contact layer. For example, with use of a vacuum evaporation method, the p-side reflecting electrode 21 is formed in a center region on the p-contact layer and the p-side transparent electrode 31 is formed in a region on the p-contact layer where the p-side reflecting electrode 21 is not formed, so that a p-side electrode shown in FIG. 2A is formed. Alternatively, with use of the vacuum evaporation method, the p-side transparent electrode 32 is formed on the p-contact layer and the p-side reflecting electrode 22 is formed in a center region of this p-side electrode 32, so that a p-side electrode shown in FIG. 2B is formed.

Figure 3:
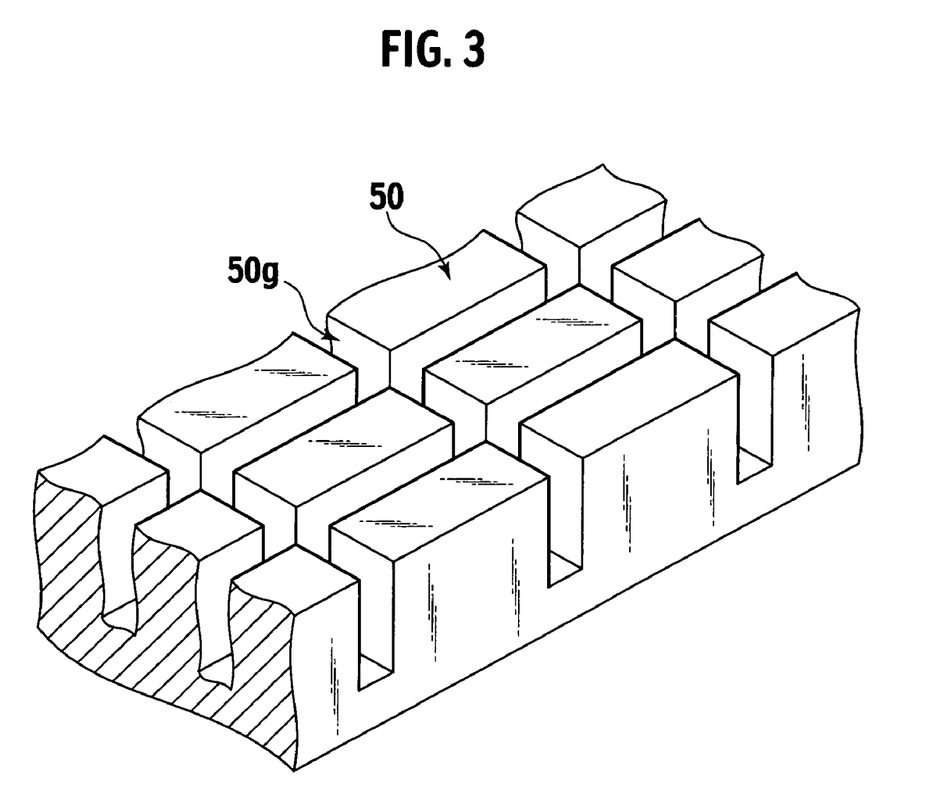
FIG. 3 is a perspective view of a supporting substrate of the semiconductor light emitting element according to the first embodiment of the present invention.

Next, as a third process, a supporting substrate forming process is carried out for forming a supporting substrate 50 in a predetermined shape. This third process is preferred to be carried out in parallel with the above-described first and second processes. For example, raw materials consisting of conductive materials such as SiC, Si, Ge, Cu, oxides of steels, CuW, CuMo, GaAs, GaP are placed in a mold so as to form a substrate including a protruded surface 50s on a surface thereof. It is to be noted that, since in actual manufacturing processes a plurality of light emitting elements are manufactured by dividing one substrate, a plurality of protruded surfaces 50s are formed on the supporting substrate. In addition, in consideration of dividing into a plurality of the light emitting elements, it is preferable that cutout portions between respective elements are formed in a groove shape in advance. As shown in FIG. 3, for example, it is preferable that the supporting substrate 50 is formed so as to have a plurality of substrate portions 50 corresponding to the light emitting elements and a dividing groove 50g located therebetween. It is to be noted that it is omitted in FIG. 3 but the protruded surface 50s is formed on the surfaces of a plurality of the substrate portions 50 corresponding to the light emitting elements. It is to be noted that formation of the supporting substrate can be carried out not only by using the mold but by, for example, using mechanical processing such as laser processing or dicing.

Next, as a fourth process, a junction process is carried out for bonding the semiconductor layer and the supporting substrate. For example, after a conductive adhesive such as a solder is applied onto the protruded surface 50s formed on the surfaces of a plurality of the substrate portions 50 formed on the supporting substrate and alignment is carried out so that a position of each protruded surface 50s corresponds with a position of the p-side reflecting electrode 20, the semiconductor layer and the supporting substrate are bonded with each other.

Next, as a fifth process, a growth substrate removing process is carried out for removing the growth substrate from the semiconductor layer. For example, with use of a polishing method, the growth substrate is polished until the surface of the n-contact layer formed thereon is exposed. It is to be noted that the way of removal of the growth substrate is not limited to polishing but may include another methods such as a method in which adhesive power of one portion of the semiconductor layer is weakened by irradiation of laser light to be removed, a method in which a adhesion-weakened portion formed on the semiconductor layer in advance is removed by applying mechanical power, or a method using etching.

Next, as a sixth process, an n-side electrode forming process is carried out for forming an n-side electrode 40 on the n-contact layer exposed in the fifth process. For example, with use of the vacuum evaporation method, the n-side electrode 40 is formed on the n-contact layer of the semiconductor layer 10. The n-side electrode 40 is preferred to be formed in a position facing the p-side reflecting electrode 20.

Lastly by dividing with use of the dicing or the like at the position of the groove 50g formed in advance on the supporting substrate, the light emitting element 100 shown in FIG. 1 can be manufactured.

[Operations and Effects]

According to the semiconductor light emitting element 100 in accordance with the above-described first embodiment of the present invention, by bonding the protruded surface 50s and the junction surface 10s which is larger in area than the region to be bonded with the protruded surface 50s, the semiconductor light emitting element 100 can receive the extruded conductive adhesive 60 with a side formed in the periphery of the protruded surface 50s. With this, in the semiconductor layer 10, the extrusion of the conductive adhesive 60 to the principal surface side, which is not adhered to the supporting substrate 50, can be reduced. Accordingly, the semiconductor light emitting element 100 can reduce generation of a leak current due to the conductive adhesive 60 extruding between an n-type semiconductor layer (an n-contact layer and an n-clad layer) in the semiconductor layer 10 or the n-side electrode 40 and a p-side electrode (a p-side reflecting electrode 20 and a p-side transparent electrode 30).

In addition, by setting ratio of the area of the protruded surface 50s to the area of the junction surface 10s to 70 to 90%, the semiconductor light emitting element 100 can reduce the extrusion of the conductive adhesive 60 to the principal surface side, which is not adhered to the supporting substrate 50, in the semiconductor layer 10 in a way that the bonding strength of the supporting substrate 50 and the semiconductor layer 10 is fulfilled and the extruded conductive adhesive 60 is caused to be easily flown onto the side formed in the periphery of the protruded surface 50s at the time of bonding the junction surface 10s and the protruded surface 50s by the conductive adhesive 60.

In addition, the supporting substrate 50 has a shape in which at least one portion thereof has the protruded surface 50s as the upper surface, and the lower surface is larger than the upper surface. Therefore, the extruded conductive adhesive 60 can be flown onto the lower surface at the time of bonding the junction surface 10s and the protruded surface 50s by the conductive adhesive 60. With this, the semiconductor light emitting element 100 can further reduce the extrusion of the conductive adhesive 60 to the semiconductor layer 10. In addition, the supporting substrate 50 has the shape in which the lower surface is larger than the protruded surface 50s, for example, the prismoid shape or the circular truncated cone shape. Therefore, the extrusion of the conductive adhesive 60 can be reduced while strength as the supporting substrate 50 supporting the semiconductor light emitting element 100 is maintained.

In addition, since a supporting substrate height 50h that is a height from the upper surface and the lower surface is 0.1 to 0.3 mm, the extruded conductive adhesive 60 is caused to be easily flown onto the side of the shape in which the lower surface is larger than the protruded surface 50s, for example, the prismoid shape or the circular truncated cone shape at the time of boning the junction surface 10a and the protruded surface 50s by the conductive adhesive 60. With this, the semiconductor light emitting element 100 can further reduce the extrusion of the conductive adhesive 60 to the principal surface, which is not adhered to the supporting substrate 50, in the semiconductor layer 10.

Second Embodiment

Semiconductor Light Emitting Device

A semiconductor light emitting device according to a second embodiment will be described below. The semiconductor light emitting element according to the embodiment can be preferably used as a semiconductor light emitting device.

Figure 4:
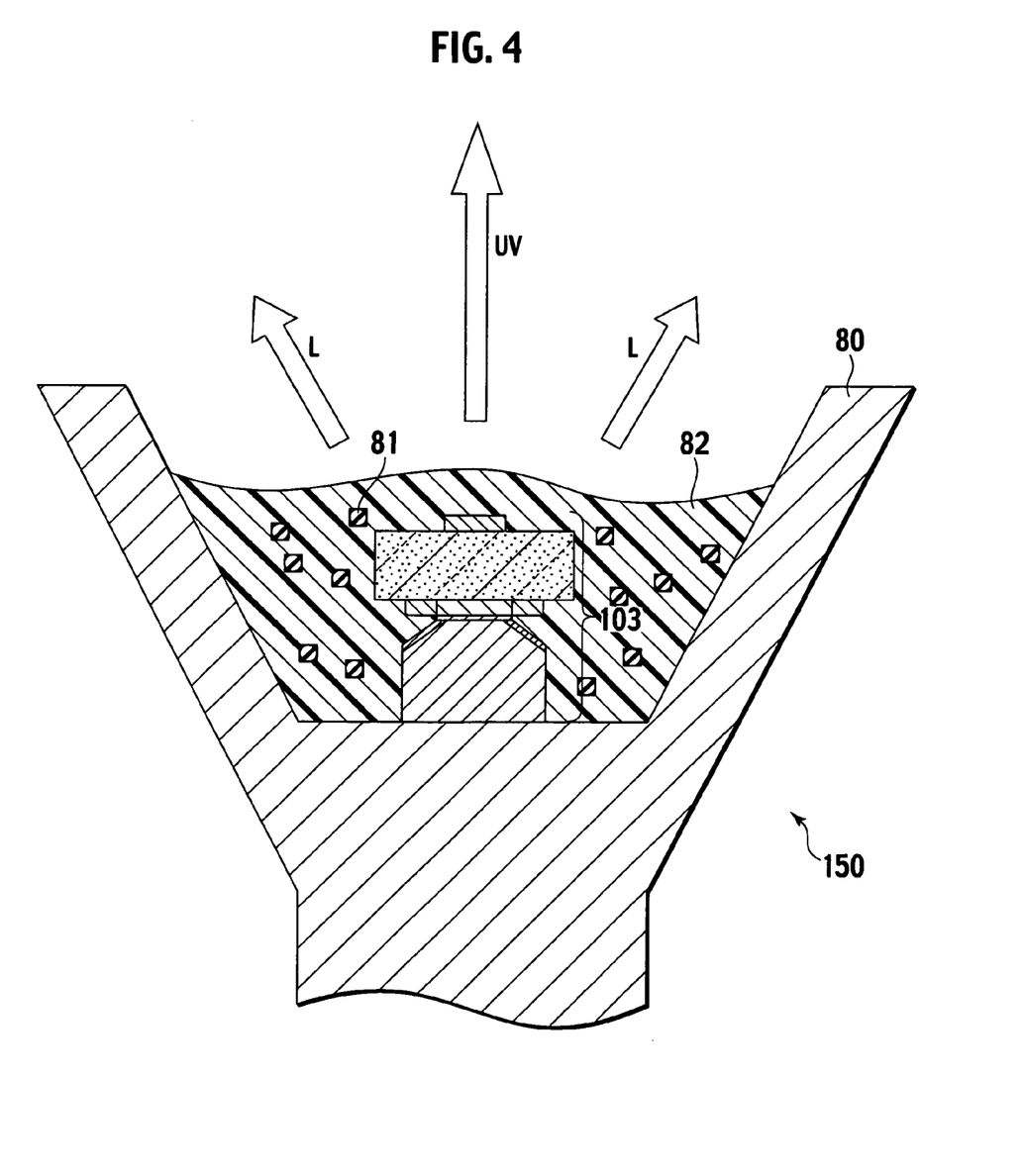
FIG. 4 is a cross section of a semiconductor light emitting device according to a second embodiment of the present invention.

FIG. 4 is a cross section showing a configuration of a semiconductor light emitting device 150 according to the second embodiment of the present invention. As shown in FIG. 4, the semiconductor light emitting device 150 includes a mounting member 80, a semiconductor light emitting element 103 mounted inside the mounting member 80, and a translucent resin 82 containing a phosphor 81 on the semiconductor light emitting element 103. It is to be noted that a wiring for mounting the semiconductor light emitting element 103 or the like is omitted in FIG. 4.

Figure 5:
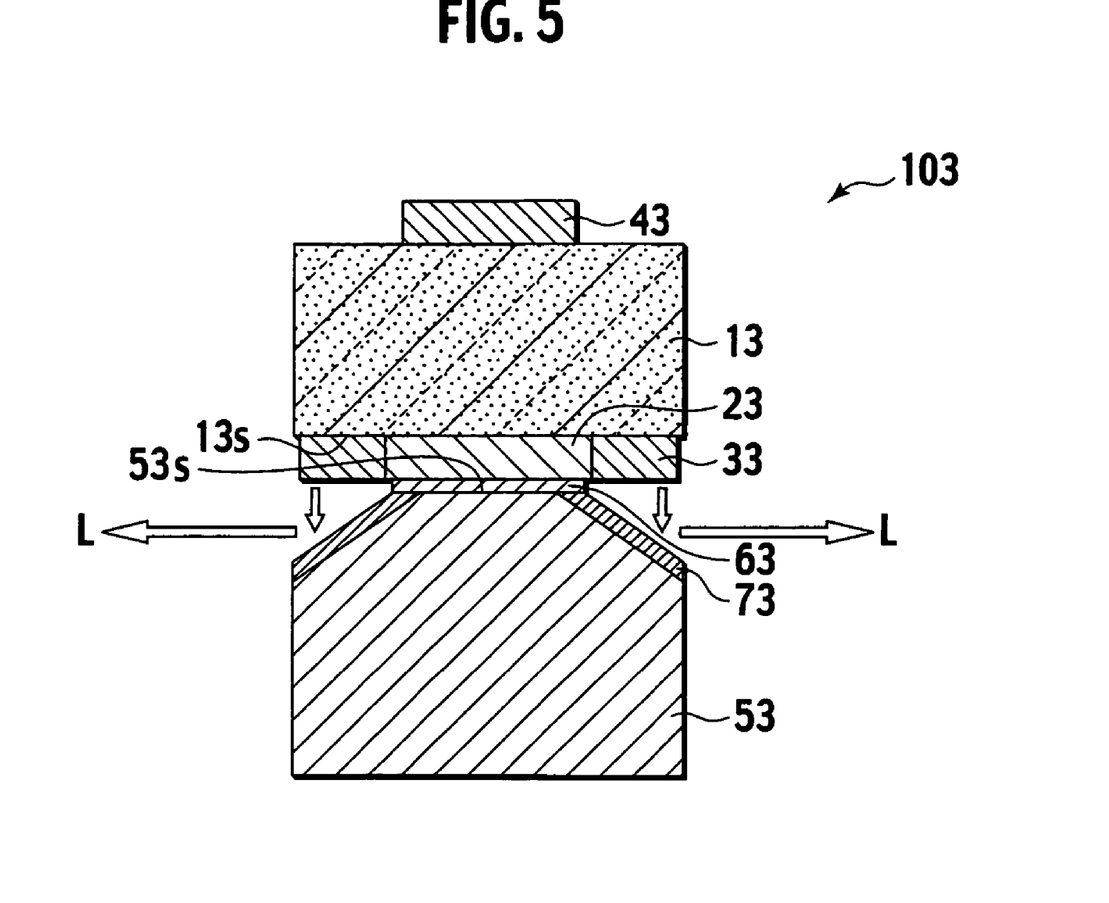
FIG. 5 is a cross section of a semiconductor light emitting element according to the second embodiment of the present invention.

As shown in FIG. 1, the semiconductor light emitting element 103 has a similar configuration with the light emitting element according to the first embodiment. Specifically, as shown in FIG. 5, the semiconductor light emitting element 103 is formed in a periphery of a protruded surface 53s in an inclined shape, and has a reflecting surface in order to reflect light emitted from a semiconductor layer 13. Specifically, the semiconductor light emitting element 103 has the reflecting surface on a side of a prismoid shape or a circular truncated cone shape, which is one portion of the supporting substrate 53.

Next, examples of materials configuring the semiconductor light emitting device 150 will be described. It is however needless to say that the present invention is not limited to these materials.

The mounting member 80 is formed with use of copper, iron or the like from the viewpoint that they are easy to be processed, and is subjected to the plate-processing with Ni on the surface thereof. In addition, the mounting member 80 is subjected to the plate-processing with Ag with a thickness of approximately 0.1 to 0.8 μm on the inside of the mounting member 80 where the translucent resin 82 containing the phosphor 81 is included. By being subjected to the plate-processing with Ag, the reflectivity of the mounting member 80 can improve reflectivity.

The phosphor 81 absorbs the light emitted from the semiconductor light emitting element 103 to converts it into light with another wavelength to be emitted outside. As the phosphor 81, for example, as the semiconductor light emitting element 103, in a case where white light is emitted with use of LED consisting of a nitride semiconductor emitting blue and blue-violet light, $Y_2O_2S$:Eu for emitting red light, ZnS:CuAl for emitting green light, $(BaMg)Al_{10}O_{17}$:Eu for emitting blue light, and the like can be used. In such a case, white light is formed by mixing red light, green light, and blue light.

The translucent resin 82 may be anything as long as the phosphor 81 can be included inside, and it is preferable to be made of a thermoplasticity resin such as, for example, an alicyclic epoxy resin and a nitrogenous epoxy resin. It is to be noted that the translucent resin 82 may be formed of another epoxy resin, a silicon resin or the like. In addition, the translucent resin 82 can contain a colorant for cutting desired wavelength, an inorganic diffusing agent for diffusing desired light, such as titanium oxide and aluminum oxide, an organic diffusion agent such as a melanin resin, a guanamine resin, and a benzoguanamine resin, an ultraviolet absorber for improving light resistance of a resin, an antioxidant, an accelerator such as organic carboxylic acid zinc, anhydride acid, a zinc chelate compound or the like, as one of various additives.

Another materials use well-known materials, and these descriptions are omitted.

FIG. 5 shows the semiconductor light emitting element 103 used in the semiconductor light emitting device 150.

The semiconductor light emitting element 103 is formed in the periphery of the protruded surface 53s of the supporting substrate 53 in an inclined shape, and has the reflecting surface for reflecting the light emitted from the semiconductor layer 13. The supporting substrate 53 has a shape in which at least one portion thereof has the protruded surface 53s as an upper surface and a lower surface is larger than the upper surface, and has the reflecting surface on a side formed by the upper surface and the lower surface. For example, the semiconductor light emitting element 103 has the reflecting surface on a side of a prismoid shape or a circular truncated cone shape, which is one portion of the supporting substrate 53. An angle formed by the reflecting surface (a reflecting film 73) and the lower surface of the supporting substrate 53 is 30 to 60 degrees. In addition, surface roughness of the reflecting surface (the reflecting film 73) is 0.5 μm and less. The reflecting surface (the reflecting film 73) is formed of the reflecting film 73 consisting of a metal with a thickness of 0.1 μm and more. For example, the reflecting film 73 is formed of Ag, Al or the like.

It is preferable that Ag is used for the reflecting film 73 in a case where the semiconductor light emitting element 103 emits near ultraviolet light. According to this, the reflectivity of near ultraviolet light with wavelength of 400 nm shows 95%, and similar reflectivity is obtained in green light with wavelength of 550 nm and red light with wavelength of 620 nm.

Figure 6:
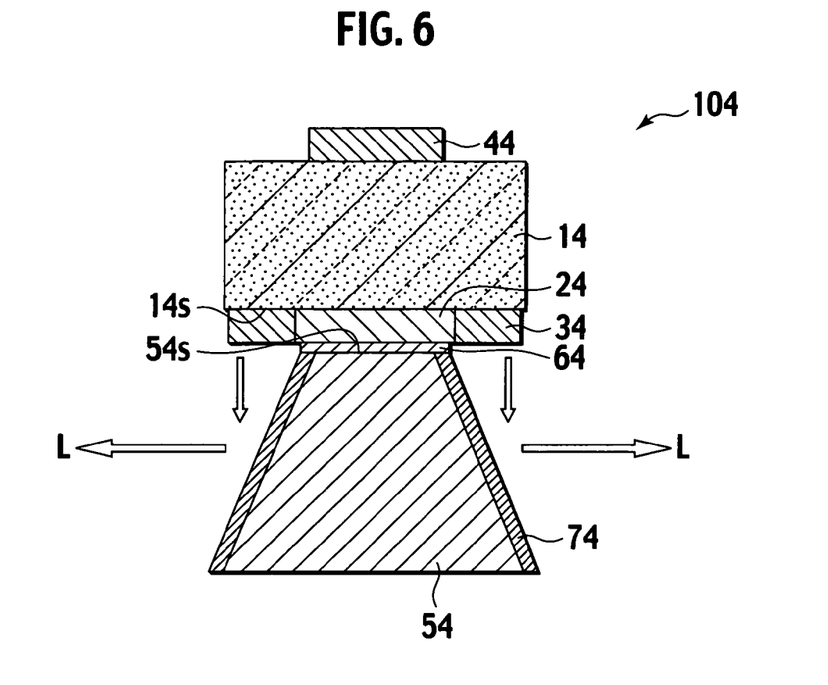
FIG. 6 is another cross section of the semiconductor light emitting element according to the second embodiment of the present invention.
Figure 7:
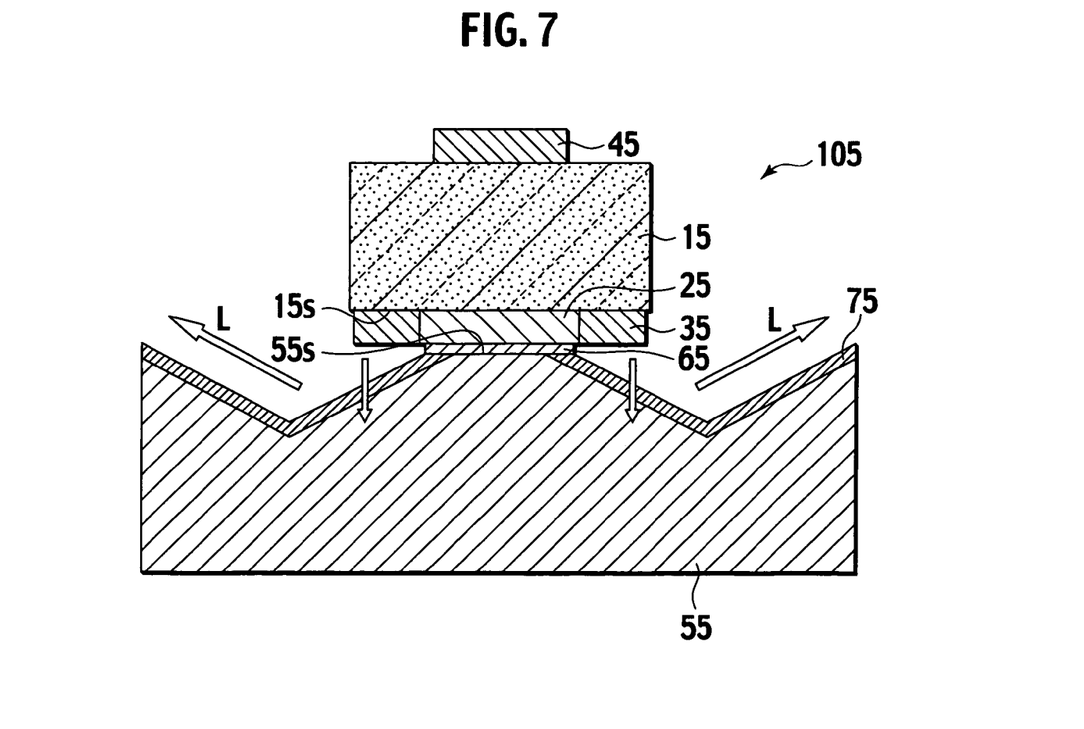
FIG. 7 is another cross section of the semiconductor light emitting element according to the second embodiment of the present invention.

The shape of the supporting substrate 53 is not limited to only FIG. 5, but like FIGS. 6 and 7, it is only necessary that sides of supporting substrates 54 and 55 are formed below protruded surfaces 54s and 55s bonded with p-side reflective electrodes 24 and 25 by conductive adhesives 64 and 65, and reflecting films 74 and 75 are included on the sides of the supporting substrates 54 and 55. According to this, the light emitted from the semiconductor layers 14 and 15 can be reflected by the reflecting films 74 and 75. It is to be noted that the surfaces of the supporting substrates 53 to 55 can be set to a reflecting surface without providing the reflecting films 73 to 75 in a case where the supporting substrates 53 to 55 are formed of reflective materials.

[Method of Manufacturing Semiconductor Light Emitting Device]

Firstly, as in the case of first embodiment, the semiconductor layer 13 is formed on the growth substrate as a first process, and the p-side electrode is formed on the p-contact layer as a second step.

Then, as in the case of first embodiment, the supporting substrate forming process is carried out for forming the supporting substrate in the predetermined shape. Here, in this process, the protruded surfaces 53s are formed on a surface of plurality of the supporting substrates which correspond to each light emitting element, and a periphery of the protruded surface is formed in an inclined shape so as to form a reflecting film 73.

Next, after the fourth to sixth processes same as in the case of first embodiment are performed, by dividing per each light emitting element, the semiconductor light emitting element 103 as shown in FIG. 5 can be manufactured.

Next, after the supporting substrate 53 of the semiconductor light emitting element 103, which is manufactured as described above, is bonded on a bottom face of mounting member 80 by a conductive adhesive, wiring of the semiconductor light emitting element 103 is performed using such as Au wire for supplying power (not shown in the FIGs).

Next, appropriate doses of a phosphor 81 in a powdered state are compounded to be diffused in a translucent resin 82. As described above, epoxy, silicon or the like can be used for the translucent resin 82 as long as the phosphor 81 is diffusible. Then, the translucent resin is applied by a well-known method onto the mounting member 80, in which the semiconductor light emitting element 103 is installed and which is wired, to be hardened. With this, the semiconductor light emitting device 150 is manufactured, and after that, a shell-type LED is manufactured by a well-known method of conversion by a translucent resin or the like.

[Operations and Effects]

According to the semiconductor light emitting device 150 in accordance with the above-described second embodiment, by bonding the protruded surface 53s on the supporting substrate 53 and the junction surface 13s that is larger than an area of a region to be bonded with the protruded surface 53s by a conductive adhesive 63, the semiconductor light emitting device 150 can receive the extruded conductive adhesive 63 in the periphery of the protruded surface. Therefore, in the semiconductor layer 13, the extrusion of the conductive adhesive 63 to the principal surface side, which is not adhered to the supporting substrate 53, can be reduced. With this, the semiconductor light emitting element 103 can reduce generation of a leak current.

In addition, the semiconductor light emitting device 150 reflects light emitted from the semiconductor layer 13 with the reflecting film 73, so that it can be outputted outside. With this, the semiconductor light emitting device 150 can output light absorbed by the p-side reflecting electrode 23 of the semiconductor layer 13, thus a light output effect can be improved. Since a conventional semiconductor light emitting device outputs light from a semiconductor layer only in a direction of an n-side electrode, there is such a problem that only the n-side electrode direction is lighted from the semiconductor layer and the light cannot be outputted to a periphery thereof. The semiconductor light emitting device 150 according to the second embodiment can output light to the periphery of the semiconductor layer 13 by having the reflecting surface (the reflecting film 73) formed on supporting substrate 53 in the inclined shape, so that uniformity of light emitting distribution can be improved.

That is, because the semiconductor light emitting device 150 according to the second embodiment can reduce the extrusion of the conductive adhesive 63 to the semiconductor layer 13 side, the generation of the leak current can be reduced, and the light output effect and the uniformity of light emitting distribution can be improved.

In addition, the semiconductor light emitting device 150 reflects the light emitted from the semiconductor layer 13 with the reflecting film 73 and absorbs the reflected light by the phosphor 81 to convert light wavelength, so that it can be outputted outside.

The angle formed by the reflecting surface (the reflecting film 73) and the lower surface of the supporting substrate 53 is set to 30 to 60 degrees, so that the semiconductor light emitting device 150 can further effectively output the light reflected by the reflecting film 73.

Since the reflecting film 73 further improves reflectivity by which a thickness of the reflecting film 73 is formed to be 0.1

μm and more. Therefore, the light from the semiconductor light emitting element 103 can be further effectively outputted from the semiconductor light emitting device 150.

Flatness of the reflecting film 73 formed on the side can be further improved by setting surface roughness of the reflecting surface (the reflecting film 73) to 0.5 μm and less. With this, the reflecting film 73 further improves reflectivity and the light of the semiconductor light emitting element 103 can be further effectively outputted from the semiconductor light emitting device 150.

Third Embodiment

Semiconductor Light Emitting Element

Figure 8:
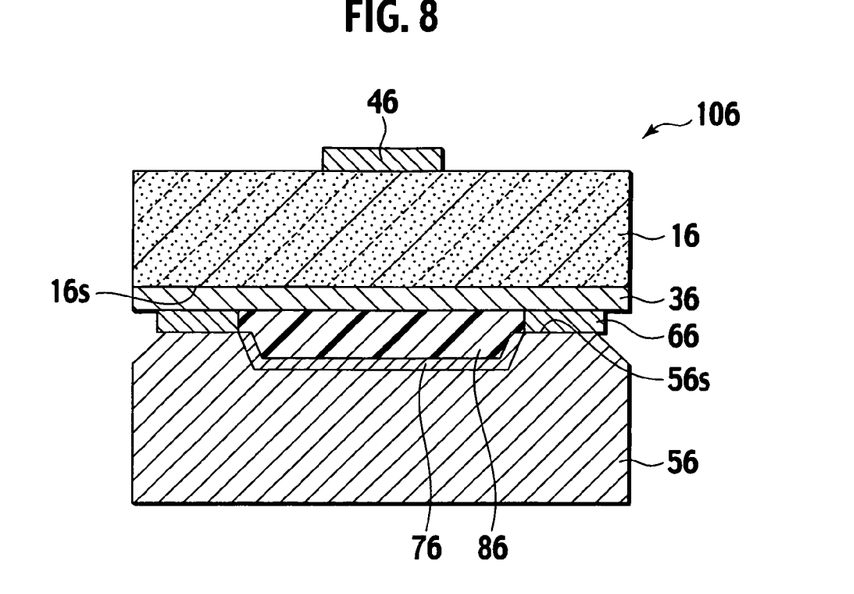
FIG. 8 is a cross section of a semiconductor light emitting element according to a third embodiment of the present invention.

A semiconductor light emitting element 106 according to a third embodiment will be described by referring to FIG. 8. It is to be noted that differences with the semiconductor light emitting element 103 used in the semiconductor light emitting device 150 according to the above-described second embodiment will be mainly described below. FIG. 8 is a cross section of a semiconductor light emitting element 106 according to a third embodiment.

As shown in FIG. 5, in the semiconductor light emitting element 103 according to the second embodiment, the protruded surface 53s is formed in a near center of the principal surface of the supporting substrate 53, and is bonded to a near center of the junction surface 13s with the p-side reflecting electrode 23 and the conductive adhesive 63 interposed between the protruded surface 53s and the junction surface 13s.

In contrast, as shown in FIG. 8, in the semiconductor light emitting element 106 according to the third embodiment, a protruded surface 56s is formed one by one on the outsides on the right and left on a principal surface of a supporting substrate 56, and is bonded on the outsides on the right and left of a junction surface 16s with a p-side transparent electrode 36 and a conductive adhesive 66 interposed between the protruded surface 56s and the junction surface 16s. The supporting substrate 56 includes a prismoid shape or a circular truncated cone shape in which has the protruded surface 56s as an upper surface and a lower surface is larger than the upper surface, on the outsides on the right and left on the principal surface. In addition, the supporting substrate 56 has a reflecting film 76 on an exposing surface on a semiconductor layer 16 side other than the protruded surface 56s.

In addition, the semiconductor light emitting element 106 includes a translucent resin 86 in a region where the conductive adhesive 66 is not bonded between the semiconductor layer 16 and the supporting substrate 56. In addition, the semiconductor light emitting element 106 may include a phosphor instead of the translucent resin 86. In addition, the semiconductor light emitting element 106 may cause the region where the conductive adhesive 66 is not bonded between the semiconductor layer 16 and the supporting substrate 56, to be a cavity.

[Operations and Effects]

According to the semiconductor light emitting element 106 in accordance with the above-described third embodiment, by bonding the protruded surface 56s and the junction surface 16s that is larger than the area of the region to be bonded with the protruded surface 56s by the conductive adhesive 66, the semiconductor light emitting element 106 can receive the extruded conductive adhesive 66 with the side formed in the periphery of the protruded surface 56s. With this, in the semiconductor layer 16, the extrusion of the conductive adhesive 66 to the principal surface side, which is not adhered to the supporting substrate 56, can be reduced. Accordingly, the semiconductor light emitting element 106 can reduce generation of the leak current that is caused by the conducting adhesive 66 extruding between an n-side electrode 46 and the p-type semiconductor layer or the p-side transparent electrode 36.

In addition, the semiconductor light emitting element 106 transmits light emitted from the semiconductor layer 16 by the p-side transparent electrode 36 and reflects it by the reflecting film 76, so that the reflected light can be outputted outside. With this, the semiconductor light emitting element 106 can improve a light output effect.

Fourth Embodiment

Semiconductor Light Emitting Element

Figure 9:
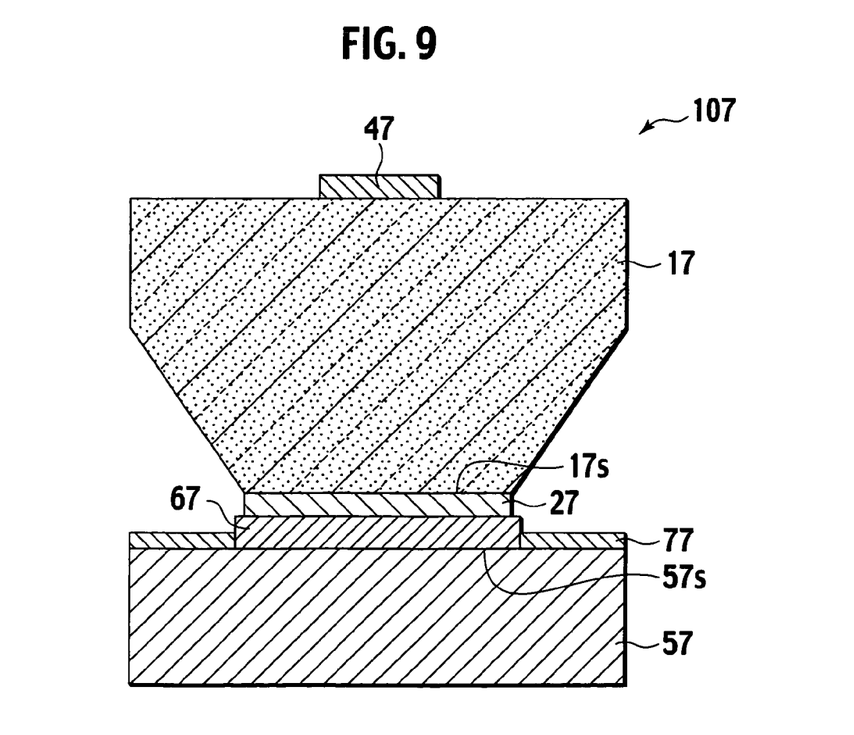
FIG. 9 is a cross section of a semiconductor light emitting element according to a fourth embodiment of the present invention.

A semiconductor light emitting element 107 according to a fourth embodiment will be described by referring to FIG. 9. It is to be noted that differences with the semiconductor light emitting element 103 used in the semiconductor light emitting device 150 according to the above-described second embodiment will be mainly described below. FIG. 9 is a cross section of a semiconductor light emitting element 107 according to a fourth embodiment.

As shown in FIG. 5, in the semiconductor light emitting element 103 according to the second embodiment, the protruded surface 53s is formed on the supporting substrate 53. By having the reflecting surface (the reflecting film 73) on the side of the supporting substrate 53, the semiconductor light emitting element 103 can improve the light output effect by reflecting the light emitted from the semiconductor layer 13 by the reflecting surface (the reflecting film 73).

In contrast, as shown in FIG. 9, in the semiconductor light emitting element 107, a protruded surface 17s is formed on a semiconductor layer 17. The semiconductor layer 17 includes a protruded surface 17s including a p-side reflecting electrode 27 and a side in a periphery of the protruded surface 17s. In addition, a supporting substrate 57 includes a junction surface 57s which opposes the protruded surface 17s and which is bonded with the protruded surface 17s with the p-side reflecting electrode 27 and the conductive adhesive 67 interposed between the protruded surface 17s and the junction surface 57s, and which is lager than an area to be bonded with the protruded surface 17s. The supporting substrate 57 includes a reflecting surface (a reflecting film 77) on the junction region 57s in a region other than a region to be bonded with the protruded surface 17s.

[Operations and Effects]

According to the semiconductor light emitting element 107 in accordance with the above-described fourth embodiment, by bonding the protruded surface 17s and the junction surface 57s that is larger than the area of the region to be bonded with the protruded surface 17s, the semiconductor light emitting element 107 can receive the extruded conductive adhesive 67 with the junction surface 57s of the supporting substrate 57 or the side formed in the periphery of the protruded surface 17s on the semiconductor layer 17. With this, in the semiconductor layer 17, the extrusion of the conductive adhesive 67 to the principal surface side, which is not adhered to the supporting substrate 57, can be reduced. Accordingly, the semiconductor light emitting element 107 can reduce generation of the leak current due to the conductive adhesive 67 extruding between the n-side electrode 47 and the p-type semiconductor layer or the p-side reflecting electrode 27.

In addition, the semiconductor light emitting element 107 emits angle-changed light from the semiconductor layer 17 depending on an angle of the side of the semiconductor layer 17 formed in an inclined shape. By reflecting such light by the reflecting surface (the reflecting film 77), the light can be outputted to the periphery of the semiconductor layer 17, so that uniformity of light emitting distribution can be improved.

Other Embodiment

The present invention has been described by the above-described embodiments, but descriptions and drawings consisting of one part of this disclosure should not be understood to limit the present invention. From this disclosure, those skilled in the art will clearly understand various alternative embodiments, examples, and operational techniques.

For example, the supporting substrate 50 according to the first embodiment can reduce the extrusion of the conductive adhesive 60 to the semiconductor layer 10 side even when it is a rectangular parallelepiped with the protruded surface 50s whose area is smaller than the junction surface 10s on a side. With this, the semiconductor emitting element 100 can reduce generation of a leak current. In addition, as for a substrate to be used in the semiconductor light emitting element 100, materials thereof are not particularly limited, but it is properly selectable as usage, such as GaN, AlGaN, InGaN, AlN, or sapphire.

In addition, for example, as the semiconductor light emitting device 150 according to the second embodiment, a white LED device using near ultraviolet light is described as an example. However, the present invention is not limited to this, but it can be used for manufacturing a semiconductor light emitting device 150 combining a phosphor which is set light outputted from the semiconductor light emitting element 103 to excitation light.

In addition, the semiconductor light emitting element 100 according to the first embodiment is configured by bonding the semiconductor layer 10 with the supporting substrate 50 on the p-side reflecting electrode 20 side. However, the present invention is not limited to this, but the semiconductor layer 10 and the supporting substrate 50 may be bonded on the n-side electrode 40.

In addition, the semiconductor light emitting element 100 according to the first embodiment has two p-side electrodes of the p-side reflecting electrode 20 and the p-side transparent electrode 30. However, the present invention is not limited to this, but a p-side electrode may be configured of any one of the p-side reflecting electrode 20 and the p-side transparent electrode 30.

In addition, the semiconductor light emitting element 103 used in the semiconductor light emitting device 150 according to the second embodiment has the reflecting film 73 on the side of the supporting substrate 53. However, the present invention is not limited to this, but fine concave-convex may be formed on the side. According to this, the semiconductor light emitting element 103 can scatter the light emitted from the semiconductor layer 13 by the fine concave-convex on the side. In addition, it is possible that a shape of the side is not set to straight line, but to a concave shape or a convex shape.

Various modifications will become possible for those skilled in the art after receiving the teachings of the present disclosure without departing from the scope thereof.

What is claimed is:

1. A semiconductor light emitting element, comprising:
   a semiconductor layer which has a reflecting electrode and a transparent electrode on at least one principal surface; and
   a supporting substrate which is bonded with the reflecting electrode by a conductive adhesive,
   wherein the supporting substrate includes a protruded surface and a surface formed in an inclined shape in a periphery of the protruded surface, and the semiconductor layer includes a junction surface which opposes the protruded surface,
   the junction surface is bonded with the protruded surface such that the reflecting electrode and the conductive adhesive are interposed between the protruded surface and the junction surface, and
   the junction surface is larger in area than a region bonded with the protruded surface, and the transparent electrode is included in a region in which the reflecting electrode is not formed on the junction surface, and transmits a light emitted from the semiconductor layer.

2. The semiconductor light emitting element of claim 1, wherein the protruded surface is formed in a near center of the principal surface of the supporting substrate, and the protruded surface is bonded with a near center of the junction surface.

3. The semiconductor light emitting element of claim 1, wherein the supporting substrate is formed in a shape in which at least one portion thereof has the protruded surface as an upper surface, and a lower surface is larger than the upper surface.

4. The semiconductor light emitting element of claim 1, the supporting substrate is formed in a prismoid shape or a circular truncated cone shape in which at least one portion thereof has the protruded surface as an upper surface, and a lower surface is lager than the upper surface.

5. The semiconductor light emitting element of claim 1, wherein a ratio of an area of the protruded surface to an area of the junction surface is 70 to 90%.

6. The semiconductor light emitting element of claim 3, wherein a height from the upper surface to the lower surface is 0.1 to 0.3 mm.

7. A semiconductor light emitting device, comprising:
   a mounting member;
   a semiconductor light emitting element which is mounted on a bottom surface of the mounting member; and
   a translucent resin which is provided in order to cover the semiconductor light emitting element inside the mounting member,
   wherein the semiconductor light emitting element includes a semiconductor layer having a reflecting electrode and a transparent electrode on at least one principal surface and a supporting substrate to be bonded with the reflecting electrode by a conductive adhesive,
   the supporting substrate includes a protruded surface bonded by the conductive adhesive,
   the semiconductor layer includes a junction surface which opposes the protruded surface, the junction surface is bonded with the protruded surface such that the reflecting electrode and the conductive adhesive are interposed between the protruded surface and the junction surface, and the junction surface is larger in area than a region to be bonded with the protruded surface, and
   the transparent electrode is include in a region in which the reflecting electrode is not formed on the junction surface, and transmits a light emitted from the semiconductor layer, and
   the supporting substrate has a reflecting surface formed in an inclined shape in a periphery of the protruded surface.

8. The semiconductor light emitting device of claim 7, wherein the translucent resin includes a phosphor which absorbs light emitted from the semiconductor light emitting element, and which converts it into light with another wavelength to be emitted outside.

9. The semiconductor light emitting device of claim 7, wherein the supporting substrate has a shape in which at least one portion thereof has the protruded surface as an upper surface, and in which a lower surface is larger than the upper surface, and an angle formed by the lower surface and the reflecting surface is 30 to 60 degrees.

10. The semiconductor light emitting device of claim 7, wherein the reflecting surface is a reflecting film formed of a metal with a thickness of 0.1 µm and more.

11. The semiconductor light emitting device of claim 7, wherein surface roughness of the reflecting surface is 0.5 µm and less.

12. The semiconductor light emitting element of claim 1, wherein the surface formed in an inclined shape is a reflecting surface.

13. A semiconductor light emitting element, comprising:

a semiconductor layer which has a reflecting electrode and a transparent electrode on at least one principal surface;

and a supporting substrate which is bonded with the reflecting electrode by a conductive adhesive, wherein the supporting substrate includes a protruded surface, the semiconductor layer includes a junction surface which opposes the protruded surface, the junction surface is bonded with the protruded surface such that the reflecting electrode and the conductive adhesive are interposed between the protruded surface and the junction surface, and the junction surface is larger in area than a region to be bonded with the protruded surface, and the transparent electrode is included in a region in which the reflecting electrode is not formed on the junction surface, and transmits a light emitted from the semiconductor layer; wherein the supporting substrate has a reflecting surface formed in a periphery of the protruded surface.

14. A The semiconductor light emitting element of claim 13, wherein the protruded surface is formed in a near center of the principal surface of the semiconductor layer, and the protruded surface is bonded with a near center junction surface.

15. A The semiconductor light emitting element of claim 13, wherein the supporting substrate is formed in a shape in which at least one portion thereof has the protruded surface as an upper surface, and a lower surface is larger than the upper surface.

16. A The semiconductor light emitting element of claim 13, wherein the supporting substrate is formed in a prismoid shape or a circular truncated cone shape in which at least one portion thereof has the protruded surface as an upper surface, and a lower surface is larger than the upper surface.

17. A The semiconductor light emitting element of claim 13, wherein a ratio of an area of the protruded surface to an area of the junction surface is 70 to 90%.

18. A The semiconductor light emitting element of claim 15, wherein a height from the upper surface to the lower surface is 0.1 to 0.3 mm.

* * * * *